(12) United States Patent
Ohyama et al.

(10) Patent No.: US 11,723,170 B2
(45) Date of Patent: Aug. 8, 2023

(54) ELECTRONIC APPARATUS

(71) Applicant: LENOVO (SINGAPORE) PTE. LTD., Singapore (SG)

(72) Inventors: Atsushi Ohyama, Yokohama (JP); Takayuki Morino, Yokohama (JP); Takuroh Kamimura, Yokohama (JP); Akinori Uchino, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 20 days.

(21) Appl. No.: 17/644,111

(22) Filed: Dec. 14, 2021

(65) Prior Publication Data

US 2022/0232729 A1 Jul. 21, 2022

(30) Foreign Application Priority Data

Jan. 19, 2021 (JP) ................................ 2021-006660

(51) Int. Cl.
*H05K 5/00* (2006.01)
*H05K 7/20* (2006.01)
*G06F 1/16* (2006.01)
*H05K 5/02* (2006.01)

(52) U.S. Cl.
CPC ....... *H05K 7/20154* (2013.01); *G06F 1/1616* (2013.01); *G06F 1/1626* (2013.01); *G06F 1/1681* (2013.01); *H05K 5/0017* (2013.01); *H05K 5/0226* (2013.01)

(58) Field of Classification Search
None
See application file for complete search history.

(56) References Cited

U.S. PATENT DOCUMENTS

| | | | | |
|---|---|---|---|---|
| 10,895,894 | B2* | 1/2021 | Jan | G06F 1/1652 |
| 10,901,468 | B2* | 1/2021 | Xia | H04M 1/0218 |
| 11,169,579 | B2* | 11/2021 | Peng | G06F 1/1616 |
| 2015/0330614 | A1* | 11/2015 | Lee | B65D 85/38 |
| | | | | 206/45.23 |

(Continued)

FOREIGN PATENT DOCUMENTS

| | | |
|---|---|---|
| JP | 08162576 A | 6/1996 |
| JP | 2018112833 A | 7/2018 |

(Continued)

*Primary Examiner* — Anthony Q Edwards
*Assistant Examiner* — Rashen E Morrison
(74) *Attorney, Agent, or Firm* — Shimokaji IP

(57) ABSTRACT

An electronic apparatus includes a first chassis having a heat generating element, a second chassis, a hinge device that connects the first chassis and the second chassis such that the first chassis and the second chassis can be rotated relative to each other between a 0-degree attitude and a 180-degree attitude, and a display provided across the first chassis and the second chassis. The hinge device has a metal hinge main body, a metal first support plate provided to be relatively movable with respect to the inner surface of the first chassis, and a metal second support plate provided to be relatively movable with respect to the inner surface of the second chassis. The electronic apparatus further includes a flexible heat conductive member in the first chassis. The heat conductive member thermally connects a heat receiving member that receives heat from a heat generating element, and the first support plate.

8 Claims, 8 Drawing Sheets

(56) References Cited

U.S. PATENT DOCUMENTS

| 2019/0041922 | A1* | 2/2019 | Kurma Raju | G06F 1/1637 |
| 2019/0354148 | A1* | 11/2019 | Delano | G06F 1/203 |
| 2021/0034116 | A1* | 2/2021 | Torres | G06F 1/1616 |

FOREIGN PATENT DOCUMENTS

| JP | 2020091723 A | 6/2020 |
| JP | 2020173653 A | 10/2020 |

* cited by examiner

ELECTRONIC APPARATUS

FIELD OF THE INVENTION

The present invention relates to an electronic apparatus having a plurality of chassis connected by a hinge device.

BACKGROUND OF THE INVENTION

In recent years, electronic apparatuses such as tablet PCs and smartphones, which have a touch panel type liquid crystal display and do not have a physical keyboard, are rapidly becoming widespread. While it is desirable that the display of this type of electronic apparatus be large when in use, it is also desirable that the display can be made small when not in use. Thus, there has been proposed an electronic apparatus configured such that not only the chassis but also the display can be folded by using a flexible display such as an organic EL (Electroluminescence) (refer to, for example, Japanese Unexamined Patent Application Publication No. 2018-112833).

SUMMARY OF THE INVENTION

For electronic apparatuses such as those described above, there is a high demand for smaller and thinner chassis. It is also necessary to secure a space for accommodating a display that can be folded into an arc shape in the chassis. Therefore, in this type of electronic apparatus, it is difficult in some cases to secure a space for installing a cooling device having a high cooling capability required for cooling heat generating elements such as a CPU. As a result, there is a concern that the electronic apparatus may develop the deterioration of the capability of a CPU or the like, or develop a localized high temperature portion (hot spot) on the outer surface of the chassis.

The present invention has been made in consideration of the problems with the prior art described above, and an object of the invention is to provide an electronic apparatus capable of securing a sufficient cooling capability.

An electronic apparatus according to the first aspect of the present invention includes: a first chassis in which a heat generating element is mounted; a second chassis adjacent to the first chassis; a hinge that connects the first chassis and the second chassis such that the first chassis and the second chassis can be rotated relative to each other between a 0-degree attitude, at which the first chassis and the second chassis are stacked to overlap each other in a surface normal direction, and a 180-degree attitude, at which the first chassis and the second chassis are mutually arranged in a direction perpendicular to the surface normal direction; and a display having a fold region that is provided across the first chassis and the second chassis and is folded as the first chassis and the second chassis rotate relative to each other, wherein the hinge device has a hinge main body made of a metal that extends along adjacent end portions of the first chassis and the second chassis and is placed so as to stretch across the adjacent end portions, a first support plate made of a metal that extends along the adjacent end portions on an inner surface side of the first chassis, is connected to the hinge main body in a relatively rotatable manner, is provided so as to be relatively movable with respect to the inner surface of the first chassis, and supports a back surface of the display between the 0-degree attitude and the 180-degree attitude, and a second support plate made of a metal that extends along the adjacent end portions on an inner surface side of the second chassis, is connected to the hinge main body in a relatively rotatable manner, is provided so as to be relatively movable with respect to the inner surface of the second chassis, and supports the back surface of the display between the 0-degree attitude and the 180-degree attitude, the electronic apparatus further including a flexible heat conductive member inside the first chassis, and the heat conductive member thermally connecting a heat receiving member that receives heat from the heat generating element and the first support plate.

The above-described aspect of the present invention can secure a sufficient cooling capability.

DETAILED DESCRIPTION OF THE INVENTION

The following will describe in detail preferred embodiments of the electronic apparatus according to the present invention with reference to the accompanying drawings.

Figure 1:
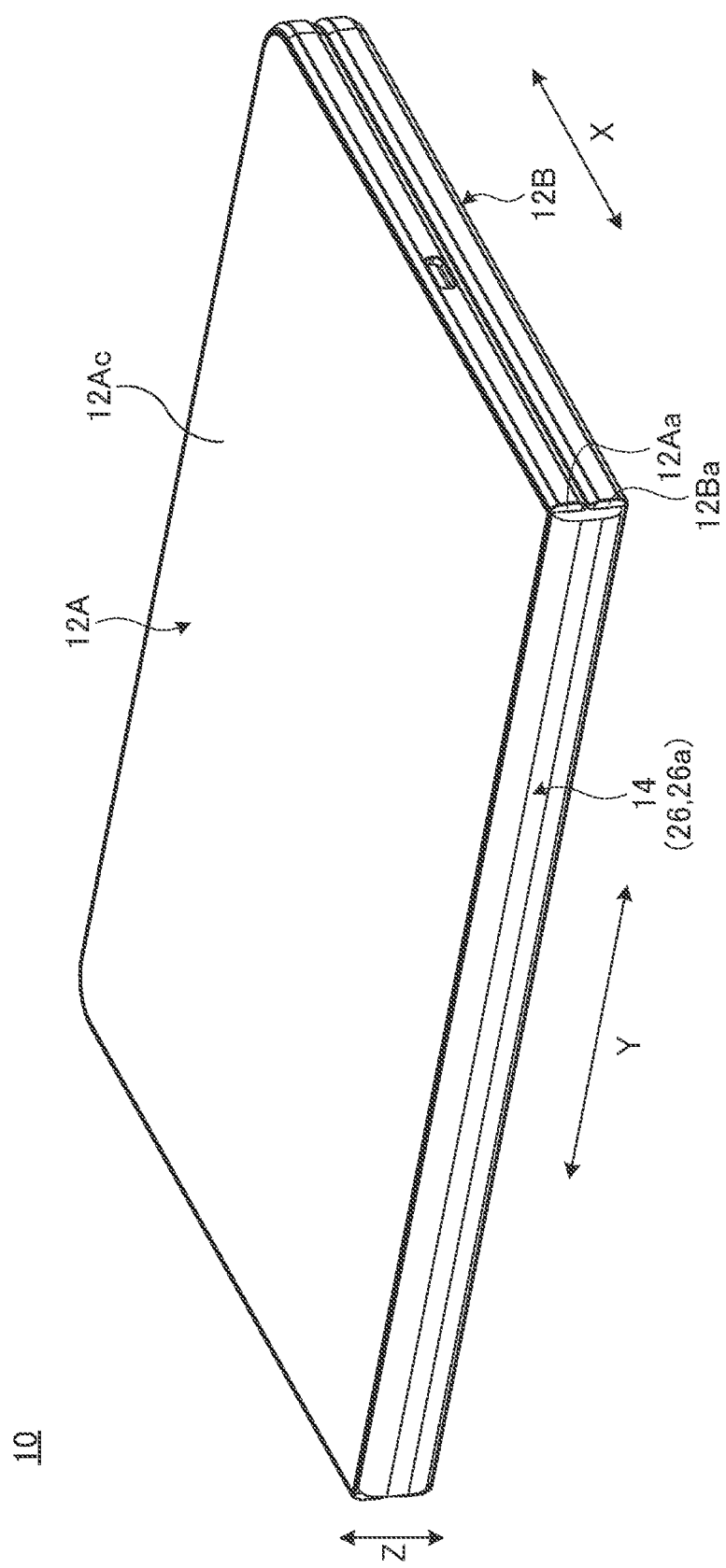
FIG. 1 is a perspective view illustrating an electronic apparatus according to an embodiment, which has been closed and set at a 0-degree attitude.
Figure 2:
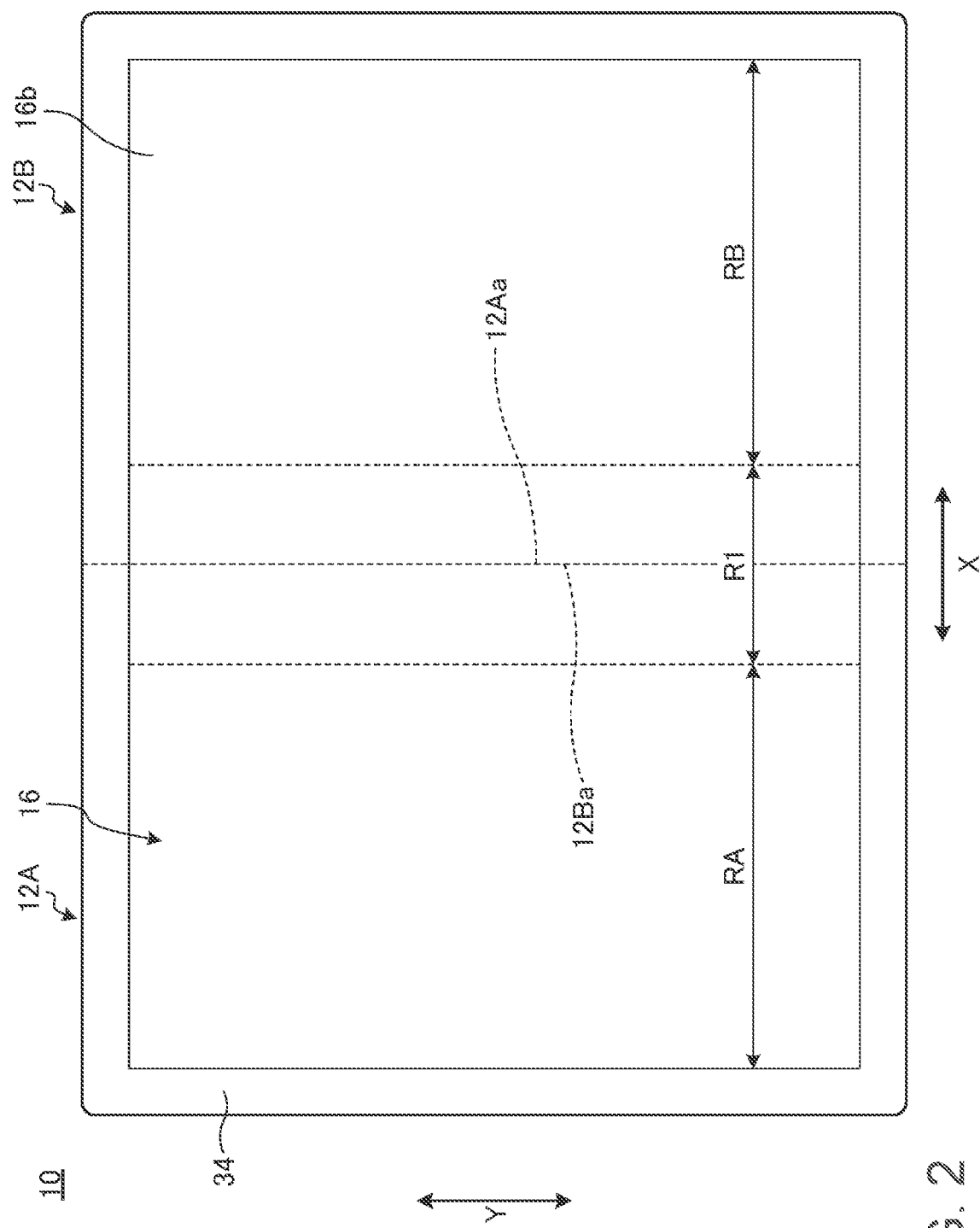
FIG. 2 is a plan view schematically illustrating the electronic apparatus illustrated in FIG. 1, which has been opened and set at a 180-degree attitude.
Figure 3:
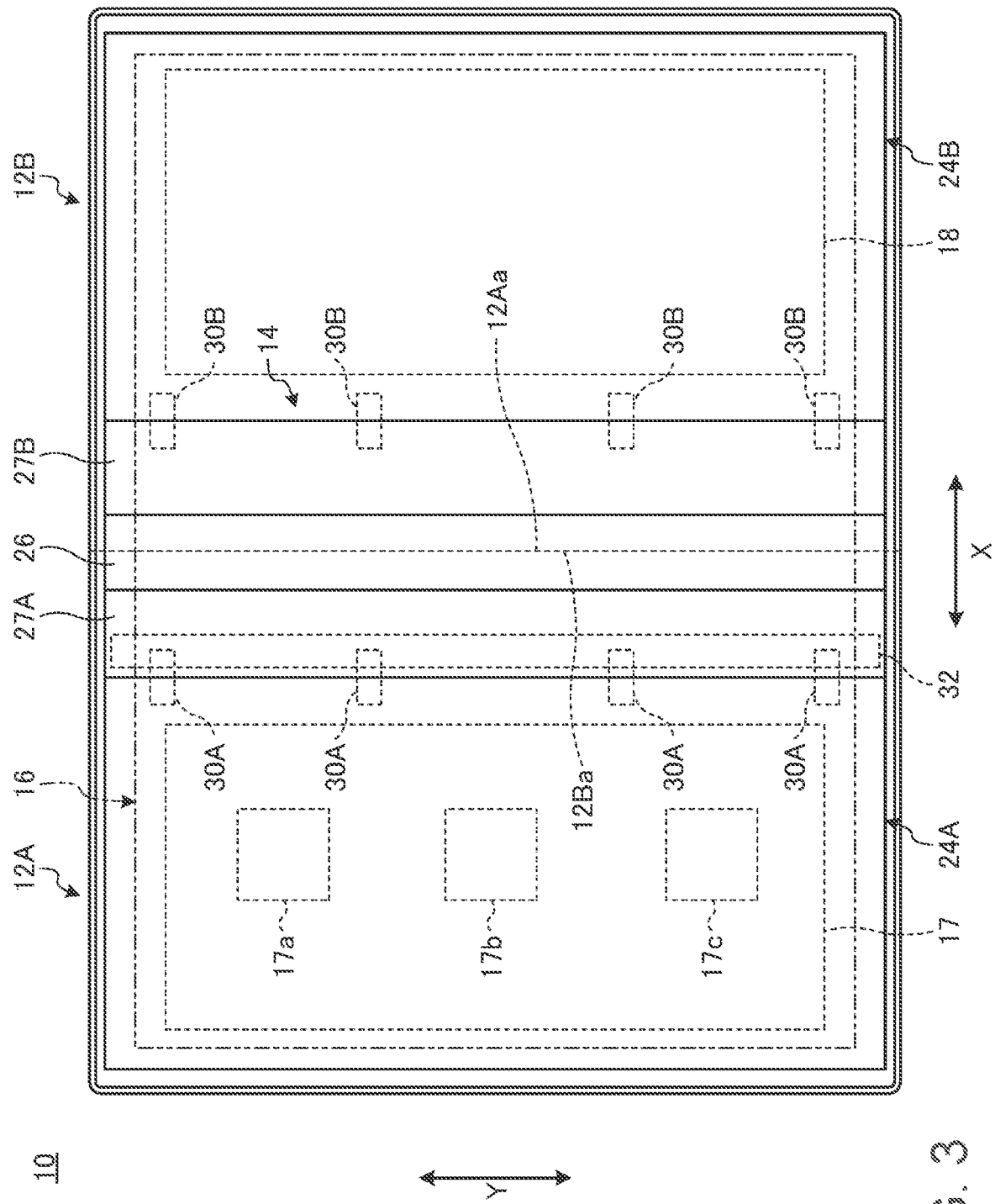
FIG. 3 is a plan view schematically illustrating the internal structure of the electronic apparatus illustrated in FIG. 2.

FIG. 1 is a perspective view illustrating an electronic apparatus 10 according to an embodiment, which has been closed and set at a 0-degree attitude. FIG. 2 is a plan view schematically illustrating the electronic apparatus 10 illustrated in FIG. 1, which has been opened and set at a 180-degree attitude. FIG. 3 is a plan view schematically illustrating the internal structure of the electronic apparatus 10 illustrated in FIG. 2.

As illustrated in FIG. 1 to FIG. 3, the electronic apparatus 10 includes a first chassis 12A and a second chassis 12B, a hinge device 14, and a display 16. The electronic apparatus 10 of the present embodiment exemplifies a tablet PC or a laptop PC that can be folded like a book. The electronic apparatus 10 may be a mobile phone, a smartphone, a portable game machine, or the like.

The chassis 12A and 12B are placed adjacent to each other. Each of the chassis 12A and 12B is placed adjacent to the other. Each of the chassis 12A and 12B is formed of, for example, a rectangular plate-like member having side walls formed upright on three sides other than the side (an adjacent end portion 12Aa or 12Ba) connected by the hinge device 14. Each of the chassis 12A and 12B is composed of a metal plate of, for example, stainless steel, magnesium, aluminum, or the like, or a fiber reinforced resin plate or the like containing a reinforcing fiber such as a carbon fiber. The hinge device 14 connects the chassis 12A and 12B in a relatively rotatable manner. The hinge device 14 also functions as a spine member that hides the gap between the adjacent end portions 12Aa and 12Ba formed at the 0-degree attitude illustrated in FIG. 1. The display 16 extends across the chassis 12A and 12B.

As illustrated in FIG. 3, the first chassis 12A includes a motherboard 17 on which various semiconductor chips such as a CPU (Central Processing Unit) 17a, a communication module 17b, and an SSD (Solid State Drive) 17c are mounted. The CPU 17a performs calculations related to the main control and processing of the electronic apparatus 10. The CPU 17a is the largest heat generating element among the electronic components mounted in the electronic apparatus 10. The communication module 17b is a device that performs information processing of wireless communication transmitted and received via antennas mounted in the chassis 12A and 12B, and corresponds to, for example, a wireless WAN and a fifth-generation mobile communication system. The SSD 17c is a storage device using a semiconductor memory. The communication module 17b and the SSD 17c are heat generating elements having a second largest amount of heat generation following that of the CPU 17a.

The second chassis 12B includes, for example, a battery device 18. The amount of heat generated by the battery device 18 is smaller than that of the CPU 17a or the like. Therefore, in the electronic apparatus 10, the amount of heat generated in the first chassis 12A is larger than the amount of heat generated in the second chassis 12B.

Hereinafter, the electronic apparatus 10 will be described by referring to the direction in which the chassis 12A and 12B are arranged as an X direction, a direction along the adjacent end portions 12Aa and 12Ba orthogonal to the X direction as a Y direction, and a thickness direction of the chassis 12A and 12B as a Z direction. Further, the rotational angle attitude between the chassis 12A and 12B will be explained by referring to a state in which the two are stacked as a 0-degree attitude (refer to FIG. 1 and FIG. 4C), and a state in which the two are arranged on left and right as a 180-degree attitude (refer to FIG. 4A). For an attitude between 0 degree and 180 degrees, the degrees therebetween will be divided and referred to as appropriate, and the attitude illustrated in, for example, FIG. 4B will be referred to as a 45-degree attitude.

Figure 4A:
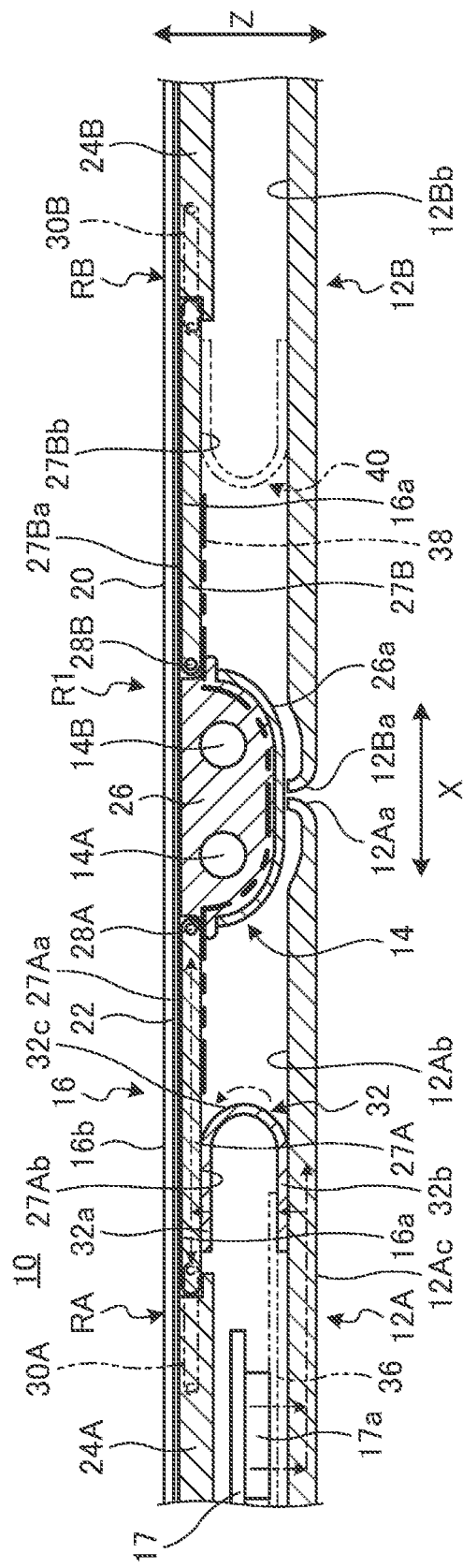
FIG. 4A is a side sectional view schematically illustrating the internal structure of the electronic apparatus at the 180-degree attitude.
Figure 4B:
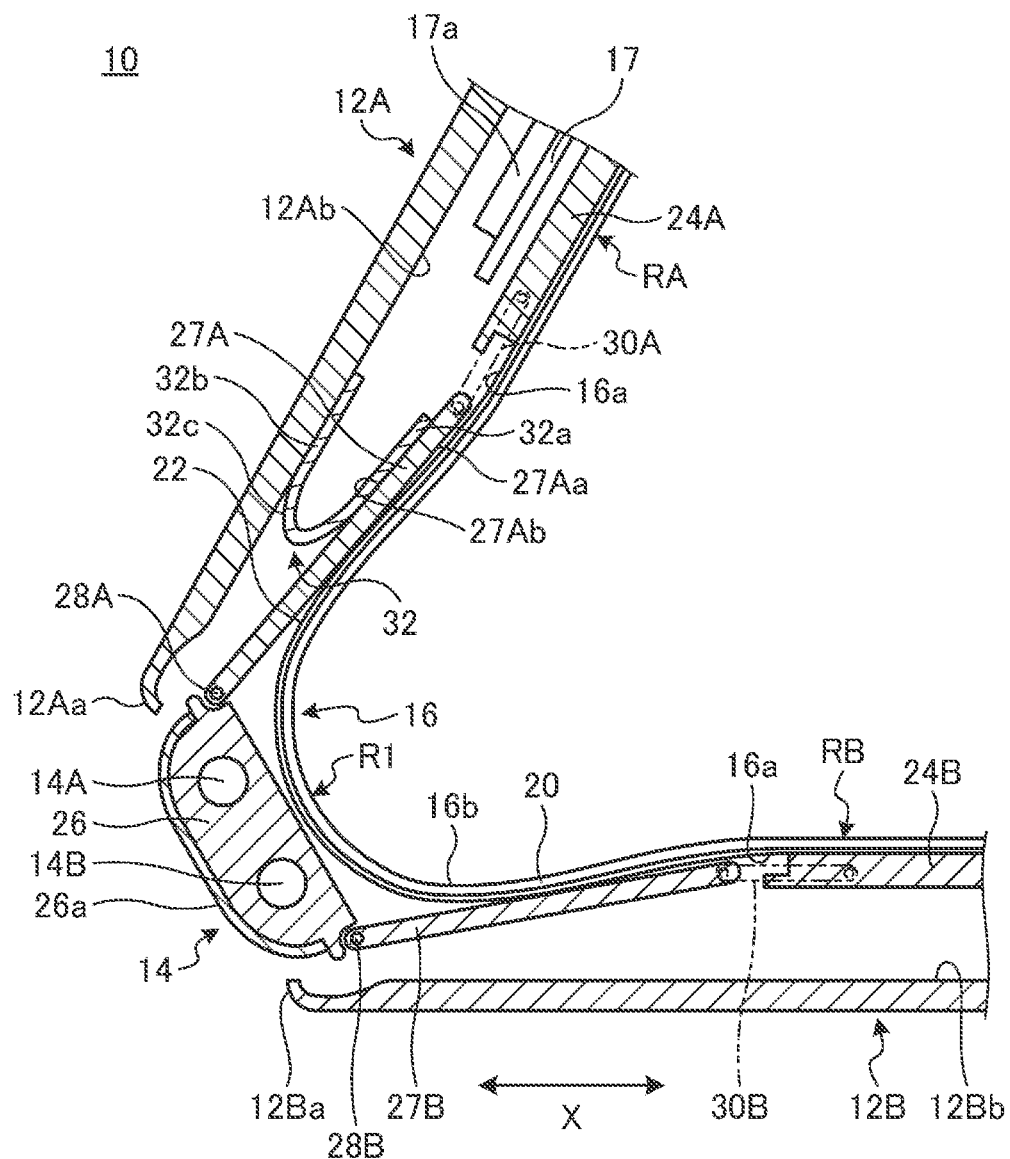
FIG. 4B is a side sectional view illustrating a state in the middle of rotation to the 0-degree attitude between chassis from the state illustrated in FIG. 4A.
Figure 4C:
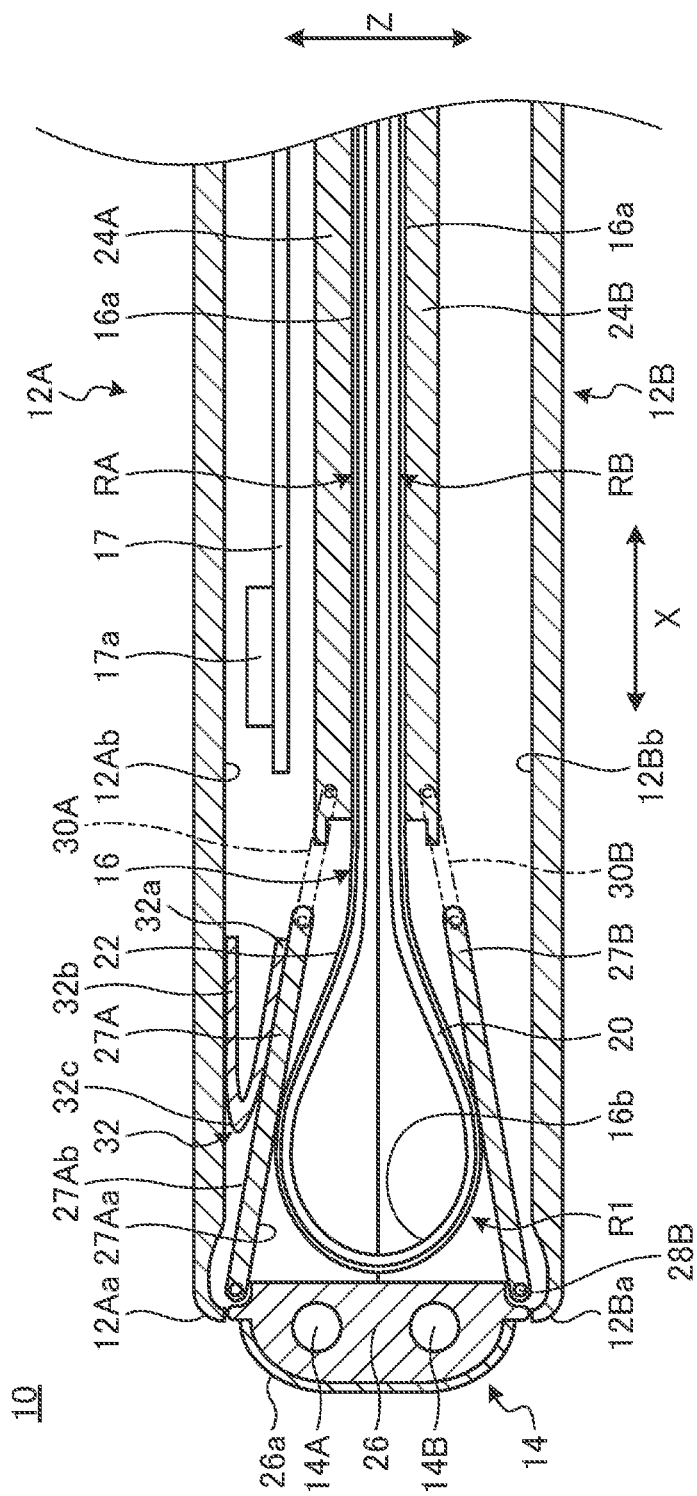
FIG. 4C is a side sectional view in a state in which the electronic apparatus illustrated in FIG. 4A is at the 0-degree attitude.

FIG. 4A is a side sectional view schematically illustrating the internal structure of the electronic apparatus 10 at the 180-degree attitude. FIG. 4B is a side sectional view illustrating a state midway through the rotation to the 0-degree attitude between the chassis 12A and 12B from the state illustrated in FIG. 4A. FIG. 4C is a side sectional view in a state in which the electronic apparatus 10 illustrated in FIG. 4A is at the 0-degree attitude.

As illustrated in FIG. 4A to FIG. 4C, the chassis 12A and 12B are connected by the hinge device 14 in a relatively rotatable manner between the 0-degree attitude (refer also to FIG. 1) and the 180-degree attitude (refer also to FIG. 2).

At the 0-degree attitude illustrated in FIG. 4C, the chassis 12A and 12B are stacked so as to overlap each other in a surface normal direction. At this time, the display 16 is placed such that a region RA on the first chassis 12A side and a region RB on the second chassis 12B side face each other, and a fold region R1, which is a boundary region between the regions RA and RB, is bent into an arc shape. At the 180-degree attitude illustrated in FIG. 4A, the chassis 12A and 12B are arranged side by side in a direction perpendicular to the surface normal direction. At this time, in the display 16, the regions RA, RB and the fold region R1 are placed side by side on an XY plane, and form a single flat plate shape as a whole.

As illustrated in FIG. 4A to FIG. 4C, the display 16 has a structure in which, for example, a sheet-like member 22 is attached to the back surface of a display panel 20. In the display 16, the region RA is relatively fixed with respect to the first chassis 12A, and the region RB is relatively fixed with respect to the second chassis 12B.

Specifically, a back surface 16a of the region RA is supported by a first plate 24A and a first support plate 27A, and fixed to the first chassis 12A through the intermediary of the first plate 24A. The back surface 16a of the region RB is supported by a second plate 24B and a second support plate 27B, and fixed to the second chassis 12B through the intermediary of the second plate 24B. The plates 24A and 24B are plates formed of a fiber-reinforced resin or a metal, and support most of the display 16 on both sides of the hinge device 14 (refer to FIG. 3). The plates 24A and 24B are fixed to the chassis 12A and 12B with screws or the like. The support plates 27A and 27B are components of the hinge device 14.

The fold region R1 is relatively movable with respect to the chassis 12A and 12B. At the 180-degree attitude, the back surface 16a of the fold region R1 is supported by a hinge main body 26 and the support plates 27A and 27B (refer to FIG. 4A). At the 0-degree attitude, the fold region R1 is bent into an arc shape, and a part of the back surface 16a is supported by the support plates 27A and 27B, and most of the back surface 16a separates from the hinge device 14 (refer to FIG. 4C).

As illustrated in FIG. 3 to FIG. 4C, the hinge device 14 of the present embodiment has the hinge main body 26, the first support plate 27A, and the second support plate 27B.

The hinge main body 26 is provided, being positioned across the adjacent end portions 12Aa and 12Ba of the chassis 12A and 12B (refer to FIG. 4A), and extends along the adjacent end portions 12Aa and 12Ba in the Y direction over substantially the full length (refer to FIG. 1 and FIG. 3). The hinge main body 26 is a block-like component made of a metal such as aluminum. The hinge main body 26 supports two hinge shafts 14A and 14B, which are aligned in the X direction at the 180-degree attitude. The hinge shaft 14A is connected to the first chassis 12A through the intermediary of a link member or the like. The hinge shaft 14B is connected to the second chassis 12B through the intermediary of a link member or the like. Housed inside the hinge main body 26 are a gear mechanism for synchronizing the rotational movements between the chassis 12A and 12B, a torque mechanism for applying a predetermined rotational torque to the rotational movements between the chassis 12A and 12B, and the like. The outer surface of the hinge main body 26 is covered with a cover material 26a.

At the 180-degree attitude illustrated in FIG. 4A, the hinge main body 26 is housed in the chassis 12A and 12B, and stretches, in the X direction, across the adjacent end portions 12Aa and 12Ba in close proximity to or in contact with each other. At the 0-degree attitude illustrated in FIG. 4C, the hinge main body 26 is placed so as to close the gap between the adjacent end portions 12Aa and 12Ba that are widely separated from each other, and serves as the spine of the electronic apparatus 10 folded like a book. At this time, the cover material 26a is exposed to the outermost surface to prevent the appearance design of the folded electronic apparatus 10 from being deteriorated (refer to FIG. 1).

The first support plate 27A is provided on an inner surface 12Ab side of the first chassis 12A and extends along the adjacent end portion 12Aa in the Y direction over substantially the full length. The first support plate 27A is a plate-like member made of a metal such as aluminum. The first support plate 27A has, for example, a plate thickness of approximately 0.5 to 3 mm, a total length (Y direction) of approximately 150 to 300 mm, and a total width (X direction) of approximately 20 to 100 mm. One end portion of the first support plate 27A in the width direction (X direction) is rotatably connected to the hinge main body 26 by using a rotation shaft 28A. The other end portion of the first support plate 27A in the width direction is connected so as to be relatively movable with respect to the first chassis 12A. Specifically, the other end portion of the support plate 27A is connected to the first plate 24A fixed to the first chassis 12A through a link 30A. The link 30A is a rod-like member extending in the X direction. One end portion of the link 30A is, for example, connected to the first support plate 27A by a rotation shaft in a relatively rotatable manner, and the other end portion thereof is connected with the first plate 24A so as to be relatively rotatable and also relatively movable in the X direction. For example, four links 30A are installed in the Y direction (refer to FIG. 3).

The second support plate 27B is provided on an inner surface 12Bb side of the second chassis 12B and extends along the adjacent end portion 12Ba in the Y direction over substantially the full length. The second support plate 27B is a plate-like member made of a metal such as aluminum. The size of the second support plate 27B may be the same as that of the first support plate 27A. The second support plate 27B is supported by the second chassis 12B side such that the second support plate 27B is attached so as to be laterally symmetrical with the first support plate 27A, and therefore, a detailed description thereof will be omitted. In other words, a rotation shaft 28B similar to the rotation shaft 28A and a link 30B similar to the link 30A are connected to the second support plate 27B.

The support plates 27A and 27B support the back surface 16a of the display 16 between the 0-degree attitude and the 180-degree attitude by front surfaces 27Aa and 27Ba. The support plates 27A and 27B relatively move with respect to the inner surfaces 12Ab and 12Bb of the chassis 12A and 12B in the X direction and a Z direction according to the rotational movement between the chassis 12A and 12B. Consequently, the support plates 27A and 27B correct the fold region R1 of the display 16 into an appropriate shape (a linear shape or a curved shape) according to a rotation angle.

As illustrated in FIG. 4A to FIG. 4C, the electronic apparatus 10 includes a graphite sheet 32 as a flexible heat conductive member in the first chassis 12A. The graphite sheet 32 is formed by processing graphite (black lead), which is an allotrope of carbon, into a sheet shape, and has high thermal conductivity. The graphite sheet 32 is a thin and flexible sheet having a plate thickness of, for example, approximately 10 μm to 1 mm.

As illustrated in FIG. 4A, the graphite sheet 32 is placed between the first support plate 27A and the first chassis 12A in a curved attitude to thermally connect the two. As illustrated in FIG. 3, the graphite sheet 32 extends over substantially the full length of the first support plate 27A in the Y direction. In the side view given in FIG. 4A, the graphite sheet 32 has a first end portion 32a thereof on the upper side fixed to a back surface 27Ab of the first support plate 27A, and a second end portion 32b thereof on the lower side fixed to the inner surface 12Ab of the first chassis 12A. The end portions 32a and 32b are fixed to surfaces 27Ab and 12Ab by using, for example, a double-sided tape or an adhesive agent that has thermal conductivity. A central portion 32c between the end portions 32a and 32b is curved between the back surface 27Ab and the inner surface 12Ab in a movable manner.

A description will now be given of the operation for rotating the chassis 12A and 12B from the 180-degree attitude to the 0-degree attitude, and working effects at that time.

First, at the 180-degree attitude illustrated in FIG. 4A, the plates 24A and 24B, the hinge main body 26, and the support plates 27A and 27B are all arranged on the same XY plane, and all the surfaces are placed to be flush, thus forming a flat plate as a whole. The entire back surface 16a of the display 16 is supported on the flat plate, forming a single flat-plate-like large screen (refer also to FIG. 2). A symbol 34 in FIG. 2 denotes a bezel member, which is a member surrounding, like a frame, an inactive region in the peripheral portion of a front surface 16b of the display 16.

Thus, at the 180-degree attitude, the electronic apparatus 10 functions as a tablet PC having a large screen. At this time, the CPU 17a generates a large amount of heat depending on the usage state of the electronic apparatus 10. If this happens, the capability of the CPU 17a itself may deteriorate, or hot spots may occur on an outer surface 12Ac of the first chassis 12A.

Therefore, the electronic apparatus 10 includes the graphite sheet 32, which thermally connects the first support plate 27A and the first chassis 12A (refer to FIG. 4A). Thus, when the heat from the CPU 17a is transferred to the first chassis 12A, the heat is transferred to the first support plate 27A through the graphite sheet 32. The arrows indicated by the chain lines in FIG. 4A schematically illustrate the movement of the heat.

Here, the first support plate 27A has a certain thickness and is composed of a metal plate (aluminum plate) elongated in the Y direction, so that the first support plate 27A exhibits high thermal conductivity and a large heat capacity. For this reason, the first support plate 27A functions as a thermal storage that stores the heat transferred from the graphite sheet 32, and at the same time, functions also as a heat spreader that dissipates the heat while diffusing the heat. In addition, the first support plate 27A is mechanically connected to the hinge main body 26 also made of a metal and the second support plate 27B. Therefore, the heat received by the first support plate 27A is further transferred also to the hinge main body 26 and the second support plate 27B, where the heat is stored also, and at the same time, the heat is diffused and dissipated. At this time, in the electronic apparatus 10 of the present embodiment, the temperature inside the second chassis 12B is lower than that inside the first chassis 12A, thus enabling efficient heat dissipation. This leads to temperature balance between the left and right chassis 12A and 12B, making it possible to suppress the generation of hot spots more reliably.

As described above, the electronic apparatus 10 of the present embodiment includes the hinge device 14 composed of a metal component having a large heat capacity, and a heat conductive member (graphite sheet 32) thermally connecting the heat receiving member (the first chassis 12A), which receives heat from the CPU 17a, and the hinge device 14. Thus, in the electronic apparatus 10, the entire hinge device 14 functions as a thermal storage and a heat spreader, so that a sufficient cooling capacity is obtained without separately installing cooling devices in the chassis 12A and 12B. Instead of the graphite sheet 32, a metal sheet of copper, aluminum, or the like may be used.

The electronic apparatus 10 may be provided with a separate cooling device 36 for cooling the CPU 17a (refer to the cooling device 36 indicated by the two-dot chain line in FIG. 4A). Examples of the cooling device 36 include a heat spreader such as a copper plate or an aluminum plate, a vapor chamber, and the like, as well as cooling fins, a blower fan, and the like connected thereto. If a configuration that includes the cooling device 36 is adopted, then the second end portion 32b of the graphite sheet 32 may be connected to a heat receiving member (e.g., a heat spreader or a vapor chamber) constituting the cooling device 36. This makes it possible to reinforce the cooling capacity of the cooling device 36 by the hinge device 14.

The electronic apparatus 10 of the present embodiment may further include a sheet-like member 38 and a graphite sheet 40 indicated by the two-dot chain lines in FIG. 4A.

The sheet-like member 38 is a thin sheet formed of a material having high thermal conductivity. The sheet-like member 38 is, for example, a graphite sheet or a metal sheet of copper, aluminum, or the like. The sheet-like member 38 extends from the back surface 27Ab of the first support plate 27A to a back surface 27Bb of the second support plate 27B through between the hinge main body 26 and the cover material 26a. The sheet-like member 38 should also extend in the Y direction over substantially the full length of the hinge device 14. Thus, the heat transferred from the graphite sheet 32 to the first support plate 27A is further efficiently transferred by the sheet-like member 38 to the hinge main body 26 and the second support plate 27B.

The graphite sheet 40 has the same properties as the graphite sheet 32, and is connected between the second support plate 27B and the second chassis 12B in the same mounting state as the graphite sheet 32. Providing the electronic apparatus 10 with the graphite sheet 40 makes it possible to dissipate, to the second chassis 12B, the heat transferred to the second support plate 27B.

A description will now be given of a case where the chassis 12A and 12B are rotated from the 180-degree attitude toward the 0-degree attitude.

In this case, as illustrated in FIG. 4B and FIG. 4C, the support plates 27A and 27B relatively pivot with respect to the chassis 12A and 12B, and relatively move in the X direction and the Z direction with respect to the chassis 12A and 12B. The fold region R1 of the display 16 is folded while being appropriately pressed by the support plates 27A and 27B that move as described above. As a result, the fold region R1 is formed substantially like a bell as illustrated in FIG. 4C at the 0-degree attitude. In other words, as illustrated in FIG. 1 and FIG. 4C, the electronic apparatus 10 of the present embodiment is in a folded state with high aesthetic quality, in which the chassis 12A and 12B are substantially parallel to each other at the 0-degree attitude. On the other hand, the fold region R1 of the display 16 is not bent and has a bell shape curved with a desired curvature, thus suppressing damage to the display 16.

As described above, the graphite sheet 32 has flexibility, and the central portion 32c has the curved shape. Consequently, during the movement toward the 0-degree attitude, the graphite sheet 32 smoothly follows the relative movement between the first support plate 27A and the first chassis 12A (refer to FIG. 4B and FIG. 4C). Thus, damage to the graphite sheet 32 or the displacement of the end portions 32a and 32b is suppressed during the rotation movement between the chassis 12A and 12B. As a result, the graphite sheet 32 can always secure the state of thermal connection between the first support plate 27A and the first chassis 12A. Consequently, when, for example, the angle between the chassis 12A and 12B is set to approximately 130 degrees to 90 degrees to use the electronic apparatus 10 in the same manner as a typical laptop PC, the hinge device 14 functions as a cooling device. Further, when, for example, images are being output to an external display from the electronic apparatus 10 set at the 0-degree attitude, the hinge device 14 functions as a cooling device.

Figure 5A:
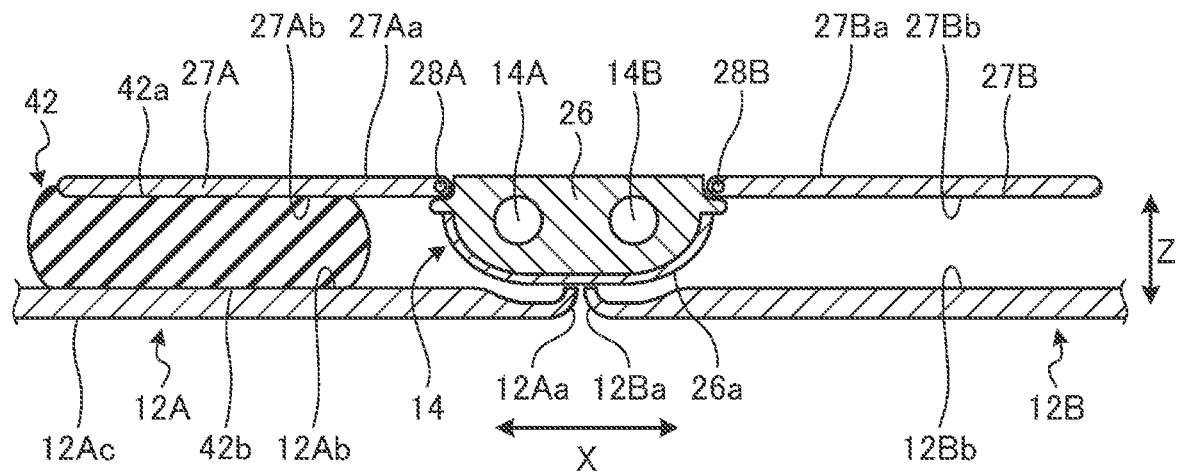
FIG. 5A is a side sectional view schematically illustrating the internal structure of an electronic apparatus provided with a thermal rubber, which is a heat conductive member, according to a first modification example.
Figure 5B:
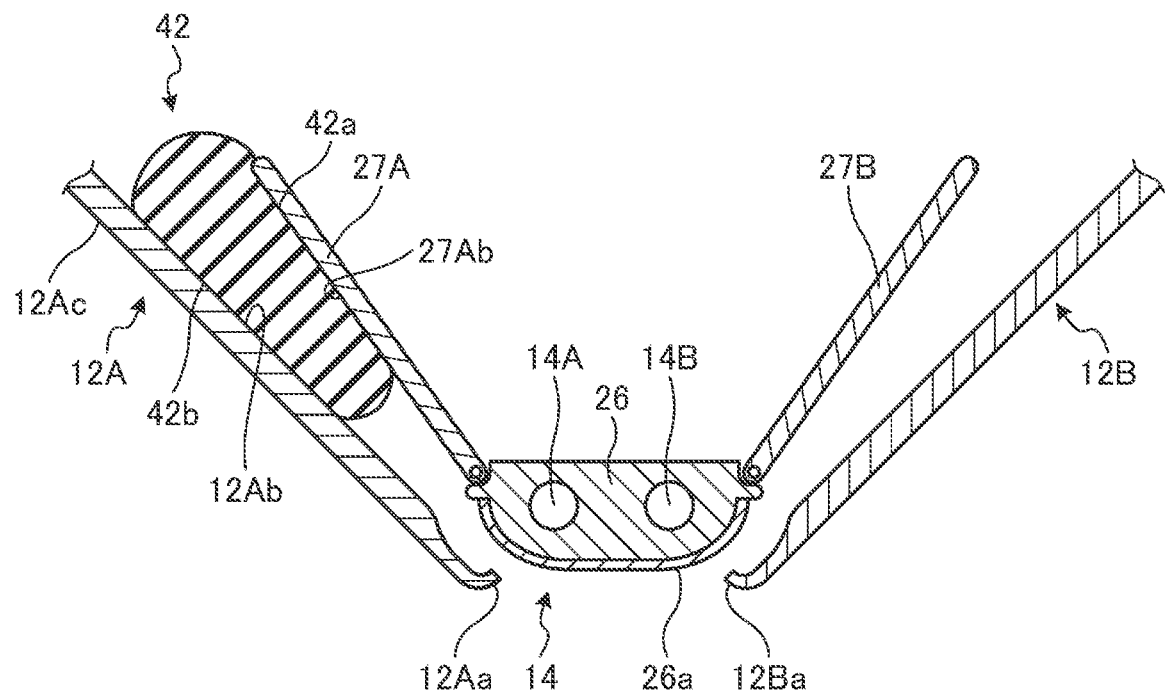
FIG. 5B is a side sectional view schematically illustrating the electronic apparatus illustrated in FIG. 5A at a 90-degree attitude.
Figure 5C:
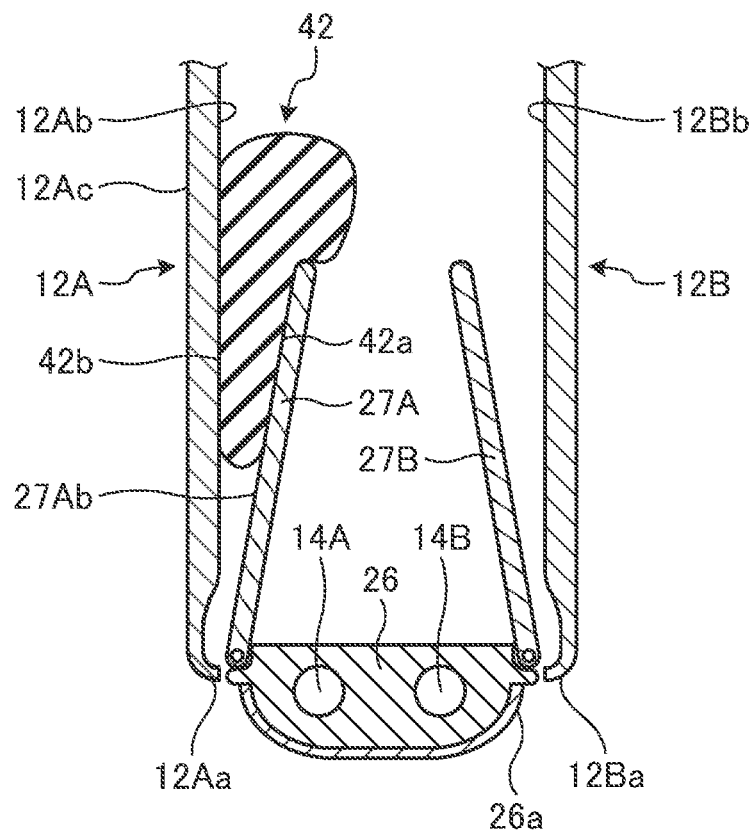
FIG. 5C is a side sectional view schematically illustrating the electronic apparatus illustrated in FIG. 5A at the 0-degree attitude.

FIG. 5A, FIG. 5B, and FIG. 5C are side sectional views schematically illustrating the internal structure of an electronic apparatus 10 provided with a thermal rubber 42, which is a heat conductive member, according to a first modification example. FIG. 5A, FIG. 5B, and FIG. 5C illustrate a 180-degree attitude, a 90-degree attitude, and a 0-degree attitude, respectively.

As illustrated in FIG. 5A to FIG. 5C, the thermal rubber 42 is a component that replaces the graphite sheet 32 illustrated in FIG. 4A to FIG. 4C. The thermal rubber 42 is a rubber material having flexibility and high thermal conductivity. The thermal rubber 42 has an upper surface 42a thereof fixed to a back surface 27Ab of a first support plate 27A by a double-sided tape or the like, and a lower surface 42b thereof fixed to an inner surface 12Ab of a first chassis 12A by a double-sided tape or the like.

The thermal rubber 42 flexibly collapses or expands in response to the relative movement of the first support plate 27A with respect to the first chassis 12A. Thus, also in the configuration using the above-described thermal rubber 42, the thermal connection between the first support plate 27A and a heat receiving member such as the first chassis 12A can be maintained while flexibly following the rotational movement between the chassis 12A and 12B, as in the configuration using the graphite sheet 32.

Figure 6:
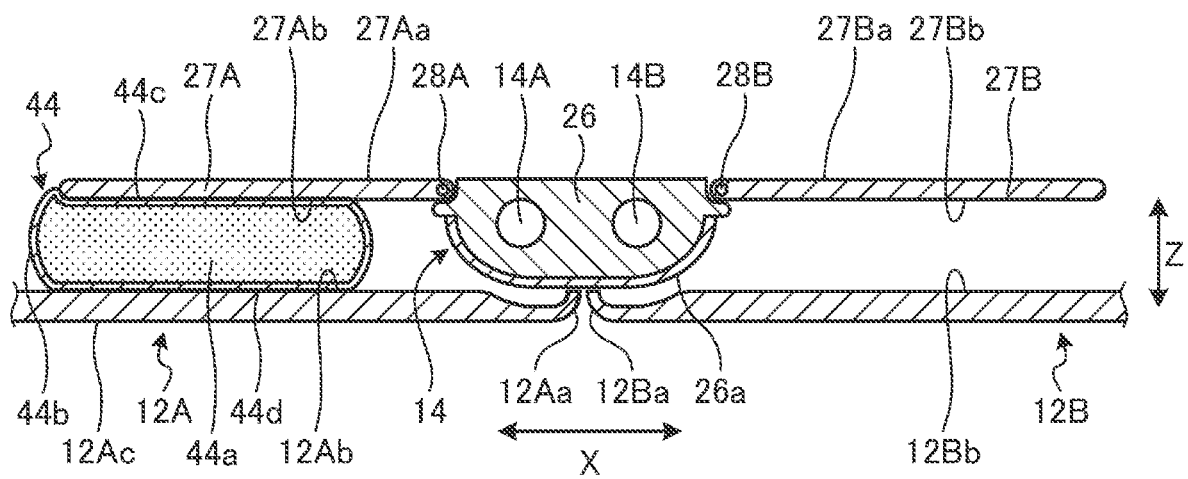
FIG. 6 is a side sectional view schematically illustrating the internal structure of an electronic apparatus provided with a thermal sponge, which is a heat conductive member according to a second modification example.

FIG. 6 is a side sectional view schematically illustrating the internal structure of an electronic apparatus 10 provided with a thermal sponge 44, which is a heat conductive member, according to a second modification example. FIG. 6 illustrates a 180-degree attitude.

As illustrated in FIG. 6, the thermal sponge 44 is a component that replaces the graphite sheet 32 illustrated in FIG. 4A to FIG. 4C or the thermal rubber 42 illustrated in FIG. 5A to FIG. 5C. The thermal sponge 44 is a member having a structure in which a thin and flexible heat conductive sheet 44b is wrapped around the outer peripheral surface of a flexible sponge material 44a. Consequently, the thermal sponge 44 has flexibility as a whole. An upper surface 44c of the thermal sponge 44 is fixed to a back surface 27Ab of a first support plate 27A with a double-sided tape or the like, and a lower surface 44d is fixed to an inner surface 12Ab of a first chassis 12A with a double-sided tape or the like. A heat conductive sheet 44b is, for example, a graphite sheet or a metal sheet of copper, aluminum, or the like. The heat conductive sheet 44b has high thermal conductivity. Therefore, the thermal sponge 44 has high thermal conductivity on the outer surface regardless of the thermal conductivity of the sponge material 44a inside.

The thermal sponge 44 flexibly collapses or expands in response to the relative movement of the first support plate 27A with respect to the first chassis 12A. Thus, also in a configuration using the above-described thermal sponge 44, the thermal connection between the first support plate 27A and a heat receiving member such as the first chassis 12A can be maintained while flexibly following the rotational movement between the chassis 12A and 12B, as in the configuration using the thermal rubber 42 or the like.

The present invention is not limited to the embodiments described above, and can of course be freely modified without departing from the gist of the present invention.

In the above, the configuration in which the heat generating elements (the CPU 17a and the like) are mounted in the first chassis 12A has been exemplified. However, a heating element with a large amount of heat generation may be mounted also in the second chassis 12B. In this case, a heat conductive member such as the graphite sheet 32 should be provided in both the chassis 12A and 12B, or in whichever chassis has a larger amount of heat generation.

Although the electronic apparatus 10 that can be folded in half like a book has been exemplified in the above, the present invention can be applied to various configurations, other than a configuration in which chassis having the same shape are folded in half, such as a double-door configuration in which small chassis are foldably connected to the left and right edges of a large chassis, an S-shaped folding configuration in which chassis having different folding directions are connected to the left and right edges of a single chassis, and a J-shaped folding configuration in which a small chassis is foldably connected to one of the left and right edges of a large chassis. The number of chassis to be connected may be four or more.

The invention claimed is:

1. An electronic apparatus comprising:
a first chassis in which a heat generating element is mounted;
a second chassis adjacent to the first chassis;
a hinge device that connects the first chassis to the second chassis such that the first chassis and the second chassis can be rotated relative to each other between a 0-degree attitude, at which the first chassis and the second chassis are stacked to overlap each other in a surface normal direction, and a 180-degree attitude, at which the first chassis and the second chassis are both arranged in a direction perpendicular to a surface normal direction; and
a display having a fold region that is across the first chassis and the second chassis and is folded as the first chassis and the second chassis rotate relative to each other,
a first plate stationarily affixed to the display;
a second plate stationarily affixed to the display;
wherein the hinge device has:
a metallic hinge main body that extends along adjacent end portions of the first chassis and the second chassis, and that stretches across the adjacent end portions;
a metallic first support plate that extends along the adjacent end portions on an inner surface side of the first chassis, is connected to the hinge main body in a relatively rotatable manner, is pivotally connected to the first plate, is relatively movable with respect to the inner surface of the first chassis, and supports a back surface of the display between the 0-degree attitude and the 180-degree attitude; and
a metallic second support plate that extends along the adjacent end portions on an inner surface side of the second chassis, is connected to the hinge main body in a relatively rotatable manner, is pivotally connected to the second plate, is relatively movable with respect to the inner surface of the second chassis, and supports the back surface of the display between the 0-degree attitude and the 180-degree attitude,
the electronic apparatus further comprising a flexible heat conductive member inside the first chassis, and
the flexible heat conductive member thermally connecting a heat receiving member, which receives heat from the heat generating element, to the first support plate.

2. The electronic apparatus according to claim 1, wherein the first support plate supports the display by a front surface thereof, and
the heat conductive member is connected to a back surface of the first support plate.

3. The electronic apparatus according to claim 2, wherein the heat conductive member is composed of a graphite sheet.

4. The electronic apparatus according to claim 3, wherein the graphite sheet has:
a first end portion fixed to the back surface of the first support plate,
a second end portion fixed to the heat receiving member, and
a central portion between the first end portion and the second end portion, and curved between the back surface of the first support plate and the heat receiving member.

5. The electronic apparatus according to claim 2, wherein the heat conductive member is composed of a rubber material having thermal conductivity.

6. The electronic apparatus according to claim 2, wherein the heat conductive member is composed of a member formed by wrapping a heat conductive sheet around an outer peripheral surface of a sponge material.

7. The electronic apparatus according to claim 2, wherein the second support plate supports the display by a front surface thereof,
the electronic apparatus further including a sheet-like member that has thermal conductivity, and extends from the back surface of the first support plate to a back surface the second support plate.

8. The electronic apparatus according to claim 7, further including:
a flexible second heat conductive member in the second chassis,
wherein the second heat conductive member thermally connects the second support plate and the second chassis.

* * * * *